United States Patent [19]

Balachandran

[11] Patent Number: 5,523,285
[45] Date of Patent: Jun. 4, 1996

[54] RAPID FORMATION OF PHASE-CLEAN 110 K (BI-2223) POWDERS DERIVED VIA FREEZE-DRYING PROCESS

[75] Inventor: Uthamalingam Balachandran, Hinsdale, Ill.

[73] Assignee: The United States of America as represented by the United States Department of Energy, Washington, D.C.

[21] Appl. No.: 315,452

[22] Filed: Sep. 30, 1994

[51] Int. Cl.[6] ........................... H01B 12/00; H01L 39/12
[52] U.S. Cl. ................. 505/425; 505/737; 505/733; 505/782; 505/492; 252/518; 252/521
[58] Field of Search ............................. 505/737, 733, 505/782; 252/518, 521

[56] References Cited

U.S. PATENT DOCUMENTS

| | | | |
|---|---|---|---|
| 4,873,073 | 10/1989 | Matsui et al. | 423/617 |
| 4,975,415 | 12/1990 | Gusman et al. | 505/1 |
| 5,055,436 | 10/1991 | Klemptner | 501/152 |
| 5,057,488 | 10/1991 | Arendt et al. | 505/501 |
| 5,114,702 | 5/1992 | Pederson et al. | 423/639 |
| 5,122,505 | 6/1992 | Gusman et al. | 505/1 |
| 5,161,728 | 11/1992 | Li | 228/124 |
| 5,215,631 | 6/1993 | Westfall | 204/64 R |
| 5,225,561 | 7/1993 | Kirlin et al. | 546/256 |
| 5,230,924 | 7/1993 | Li | 427/229 |
| 5,248,079 | 9/1993 | Li | 228/121 |
| 5,354,921 | 10/1994 | Matsubara et al. | 505/121 |
| 5,392,982 | 2/1995 | Li | 228/124.5 |
| 5,395,821 | 3/1995 | Kroeger et al. | 505/431 |

FOREIGN PATENT DOCUMENTS 2275799A   5/1989   Japan.

OTHER PUBLICATIONS

Minami et al. *Glass Formation of High–Tc Compound BiCaSrCu₂O₄ by Rapid Quenching* Jap. Journal of App. Physics May 1988 pp. L777–L778.
Synthesis and microstructure of Bi1.8PbO.4Sr2Ca2.2Cu3Ox obtained from freeze–dried precursors, P. Krishnaraj, et al, Physica C215 (1993) 305–312, Received in the library of Argonne National Laboratory, Oct. 11, 1993.
Krishnaraj et al *Synthesis & microstructure of BiPbSr-CaCuO obtained from freeze–dried precursors*. Physica C215 (1993) 305–312.

*Primary Examiner*—Paul Lieberman
*Assistant Examiner*—Wyatt B. Pratt
*Attorney, Agent, or Firm*—Mark P. Dvorscak; Robert Fisher; William R. Moser

[57] ABSTRACT

A process for the preparation of amorphous precursor powders for Pb-doped $Bi_2Sr_2Ca_2Cu_3O_x$ (2223) includes a freeze-drying process incorporating a splat-freezing step. The process generally includes splat freezing a nitrate solution of Bi, Pb, Sr, Ca, and Cu to form flakes of the solution without any phase separation; grinding the frozen flakes to form a powder; freeze-drying the frozen powder; heating the dried powder to form a dry green precursor powders; denitrating the green-powders; heating the denitrated powders to form phase-clean Bi-2223 powders. The grain boundaries of the 2223 grains appear to be clean, leading to good intergrain contact between 2223 grains.

6 Claims, 9 Drawing Sheets

RAPID FORMATION OF PHASE-CLEAN 110 K (BI-2223) POWDERS DERIVED VIA FREEZE-DRYING PROCESS

CONTRACTUAL ORIGIN OF THE INVENTION

The U.S. Government has rights in this invention pursuant to Contract No. W-31-109-ENG-38 between the U.S. Department of Energy and the University of Chicago.

BACKGROUND OF THE INVENTION

This invention relates to an improved process of preparing Bi—Sr—Ca—Cu—O (BSCCO) powders, and more particularly, to a process for preparing BSCCO powders that utilize freeze-drying.

The best superconductors are those which are of single phase material rather than a variety of different compounds. However, it is very difficult to prepare the phase pure materials such as BSCCO (Bi—Sr—Ca—Cu—O). Chemical methods such as coprecipitation often result in sequential precipitation while sol-gel processing leads to carbonate formation due to the presence of citric acid or acetic acid. The freeze-drying of nitrate solutions has also been reported.

Since the discovery of superconductivity in the BSCCO system, much effort has been focused on the synthesis of the superconducting phases of BSCCO, in particular, the $Bi_2Sr_2Ca_2Cu_3O_x$ (2223) phase with a superconducting transition temperature ($T_c$) of 110K. It is difficult to produce the 2223 phase without the partial substitution of Pb for Bi to promote the formation and stabilization of the 2223 phase. The formation of the 2223 phase is promoted by synthesis in reduced oxygen partial pressure and modification of the initial composition with excess Ca and Cu. Production of a material with a high volume fraction of the 2223 phase by conventional solid-state processing requires very long heat treating times, on the order of 150 to 300 hours (i.e., about 1 to 2 weeks). Solid-state reaction techniques commonly employed in the synthesis of these compounds have several disadvantages for multicomponent oxide systems such as $(BiPb)_2Sr_2Ca_2Cu_3O_x$. Such techniques do not yield chemically homogeneous precursors, and the rate of 2223 phase formation is slow due to transport limitations in the solid state. A further disadvantage arises from segregation due to the slow decomposition of $SrCO_3$ and $CaCO_3$ when these are used as starting materials.

Chemical methods such as coprecipitation often result in a sequential precipitation of the elemental compounds serving only to reduce the particle size of the same components used in the solid state techniques. Such processes typically employ oxalic acid, the presence of which could lead to the formation of $SrCO_3$ and $CaCO_3$. Sol-gel processing leads to similar problems of carbonate formation due to the presence of citric acid or acetic acid.

To overcome problems of chemical inhomogeneities in the precursor material, as well as the presence of carbonaceous anions, freeze-drying has been applied to the synthesis of $YBa2Cu_3O_x$ and has recently been applied to the synthesis of $(BiPb)_2Sr_2Ca_2Cu_3O_x$. However, the final material contained, in addition to the 2223, detectable amounts of 2212 plus a number of other compounds even after more than 60 hours of calcination.

Accordingly, it is an object of the present invention to provide a process for preparing BSCCO superconducting powders utilizing freeze-drying.

It is another object of the present invention to provide a process for preparing BSCCO superconducting powders such that phase separation is avoided and phase-pure Bi-2223 is obtained.

A further object of the present invention is to provide a process for preparing BSCCO superconducting powders having a substantially reduced processing time.

SUMMARY OF THE INVENTION

A process for the rapid formation of phase-clean 110K (Bi-2223) superconducting powders can include splat freezing a nitrate solution of Bi, Pb, Sr, Ca, and Cu to form flakes of the solution without any phase separation; grinding the frozen flakes to form a powder; freeze-drying the frozen powder; heating the dried powder to form a dry green precursor powders; denitrating the green-powders; and heating the denitrated powders to form phase-clean Bi-2223 powders.

The concentration of Bi(Pb) is kept fixed, while the concentration of the remaining cations in the nitrate solution is scaled accordingly. An important step includes establishing the pH of the nitrate solution in the range of 0.3 to 0.7.

The splat-freezing step generally includes injecting the nitrated solution of Bi, Pb, Sr, Ca, and Cu onto a liquid nitrogen cooled block such that the solution immediately freezes. The drying step includes transferring the powder to a freeze-dryer initially operating at a temperature of about −40° C. and gradually rising to a temperature of about 20° C. The powder is subjected to heating to a temperature of about 125° C. under an atmosphere of argon, such that the powder is dehydrated so that melting of the powder is avoided during subsequent heating. The denitrating step includes flash-calcining the dehydrated powder at a temperature between 600° C. and 730° C. in a 22% $O_2$ gas flow. Phase-pure-2223 is then formed by heating the denitrated powder to about 840° C. for less than 12 hours.

BRIEF DESCRIPTION OF THE DRAWINGS

The above-mentioned and other features of the invention will become more apparent and be best understood, together with the description, by reference to the accompanying drawings, in which.

DETAILED DESCRIPTION OF THE INVENTION

Figure 1:
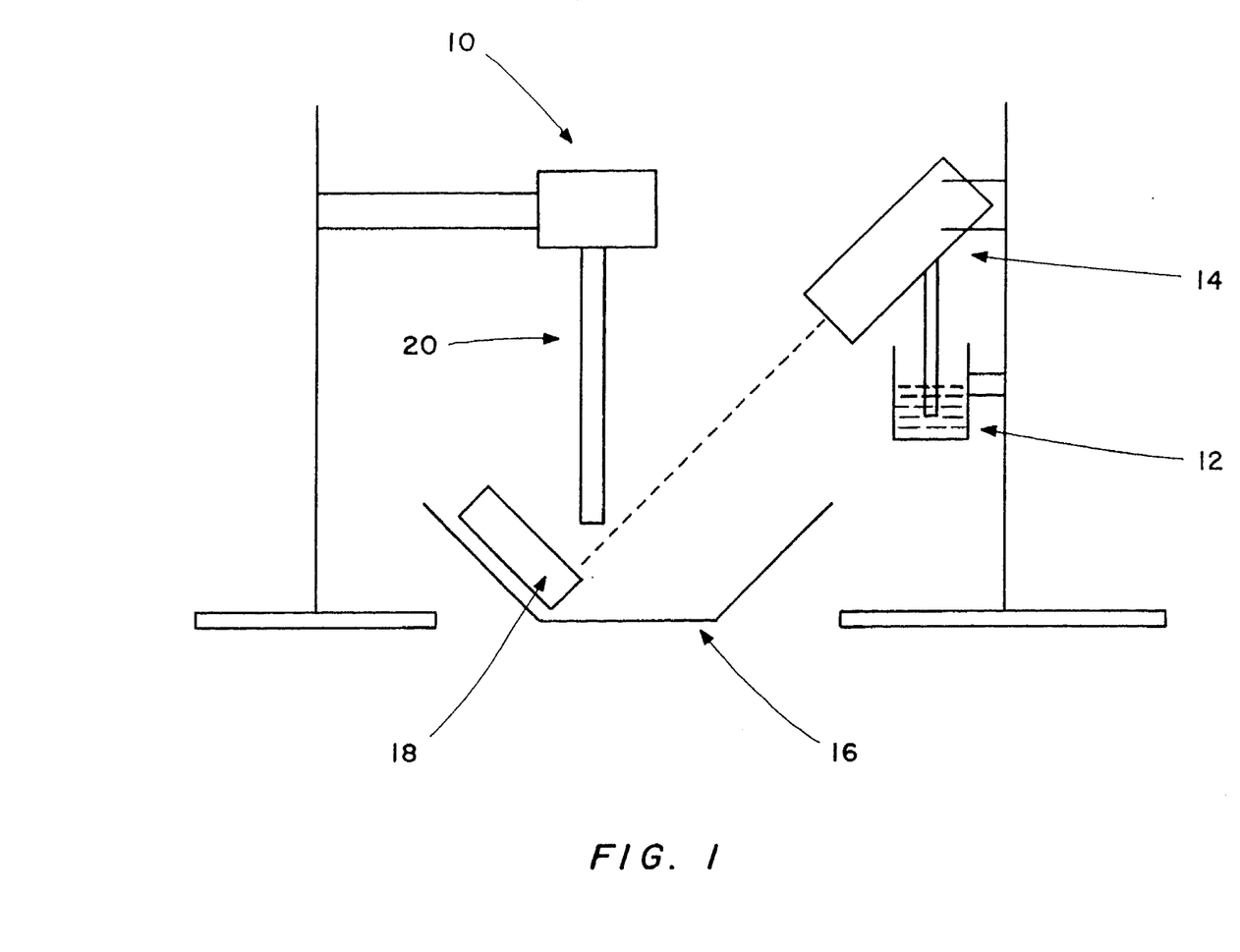
FIG. 1 shows a schematic of an apparatus that is used to splat freeze the nitrate solution to form flakes without phase separation in accordance with the present invention.

Referring to FIG. 1, a schematic of an apparatus 10 used in accordance with the present invention is shown. Solutions of Bi, Sr, Ca and Cu nitrates are first prepared using distilled-deionized water. These solutions were characterized by thermogravimetric analysis (TGA) to determine the cation content. The solutions were mixed in the cation ratio Bi/Pb/Sr/Ca/Cu=1.8:0.4:2:2.2:3, with the Pb added in the form of PbO. The solution was diluted to a concentration of 0.1M in Bi. The pH of the solution was adjusted to fall in the range of 0.3–0.7. The solution, now designated as 12 in FIG. 1, is injected through an injector 14 onto a Teflon-coated stainless steel block 18 cooled to liquid nitrogen temperature from a vessel 16 containing liquid nitrogen. This splat-freezing causes the solution to freeze immediately upon contact with the block 18. The resulting flakes of frozen material are then ground using a grinding tool 20, such as a high-shear homogenizing tool (IKA Works W45 MA), to a particle size of less than 20 µm.

The frozen powder was then transferred to a commercial freeze drier (Edwards High Vacuum, Supermodulo 45) preset to a temperature of –40° C. and operated at a pressure of 0.1 mbar. Sample temperature and chamber pressure were continuously monitored and the temperature was raised to 20° C. over a period of 2 days. The dried powder was then transferred to an oven and heated to 125° C. at a rate of 5° C./hr under flowing argon.

The dehydrated precursor was then transferred to a furnace preheated to temperatures between 600° C. and 730° C. and flash-heated in a 22% $O_2$ (balance Ar) gas flow. The denitrated powders were then ground, pressed into pellets and introduced into a furnace preheated to 845° C. and sintered for varying times under a 7% $O_2$ atmosphere.

Differential thermal analysis (DTA) and TGA were used to study the dehydration and denitration behavior of the samples. X-ray diffraction (XRD) was used to characterize the phase content of the samples and determine the extent of the 2223 phase formation. Scanning electron microscopy (SEM) and transmission electron microscopy (TEM) were used to characterize the microstructure of the samples, while energy-dispersive spectroscopy (EDS) was used for compositional analysis.

Figure 2:
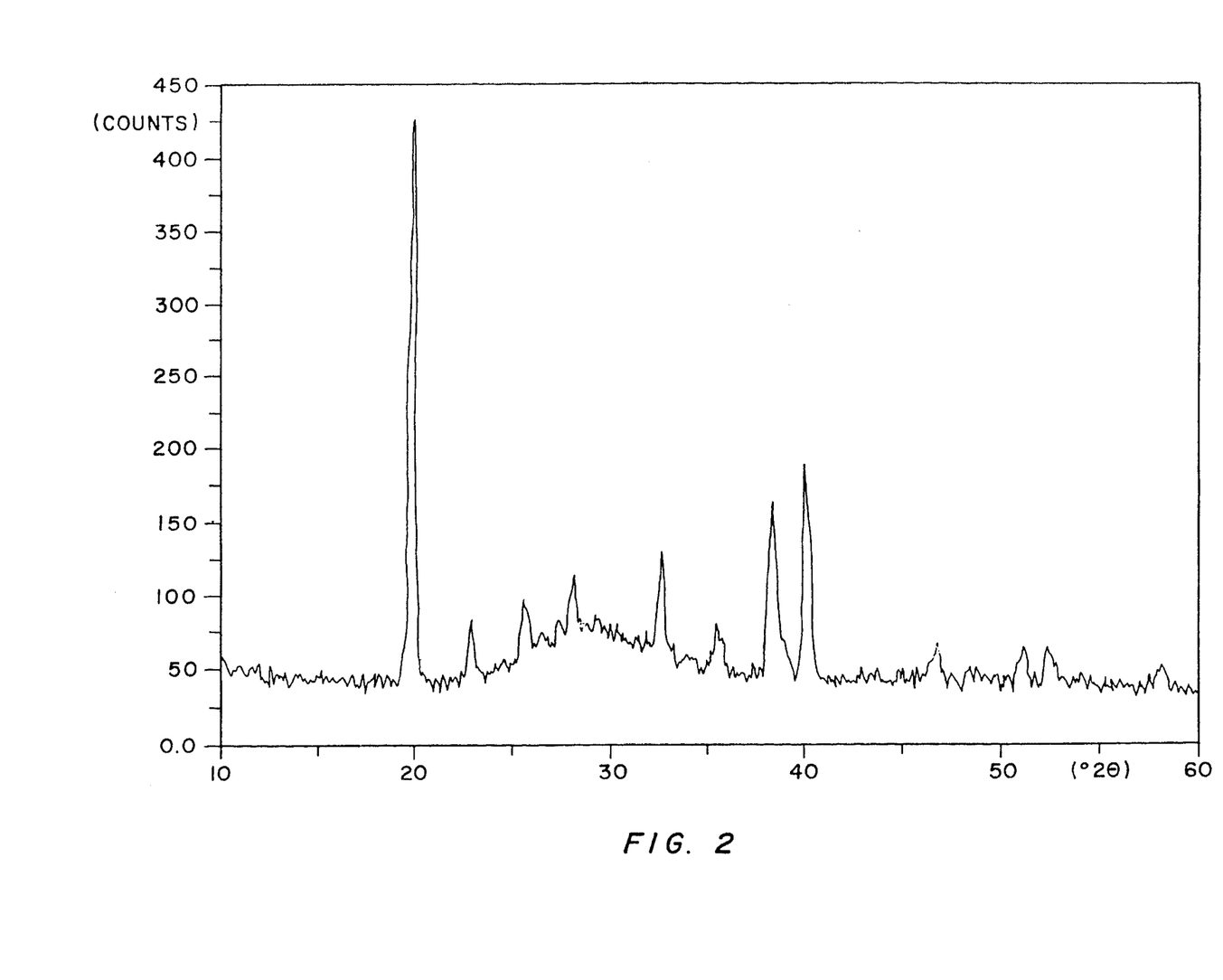
FIG. 2 shows a XRD plot of a freeze-dried powder dried to 120° C. indicating the amorphous nature of the powders obtained in the freeze-drying process of the present invention.
Figure 3:
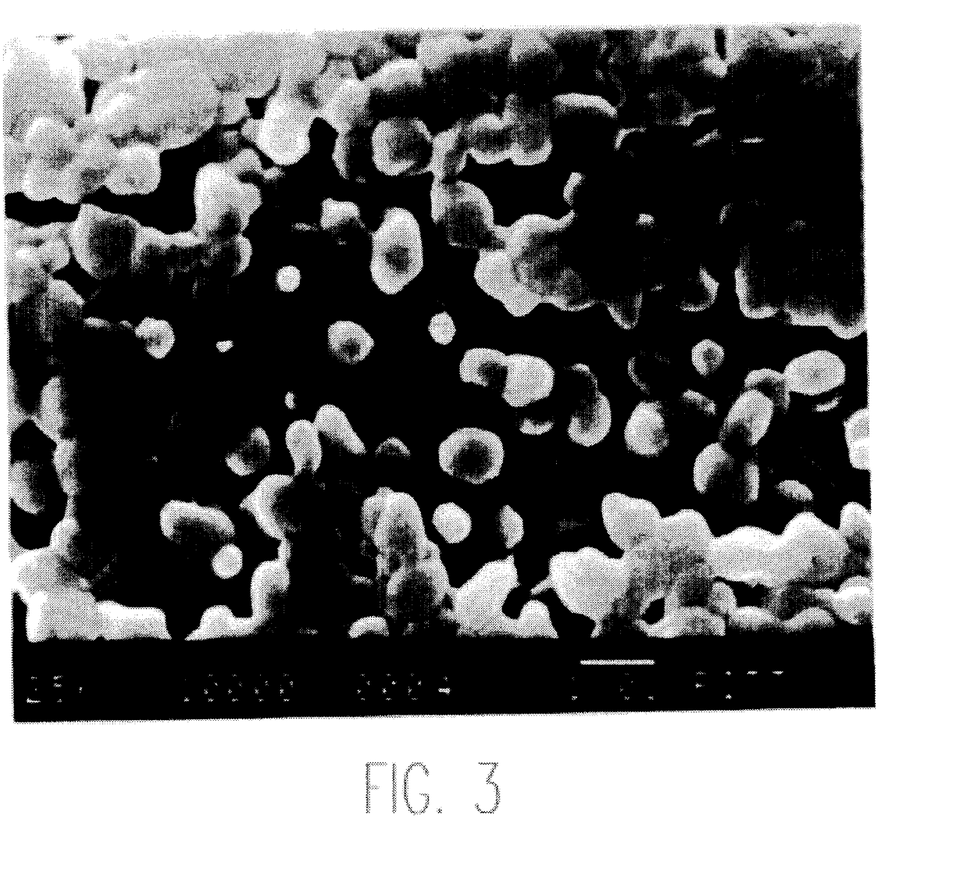
FIG. 3 is an SEM micrograph showing the particle morphology of a freeze-dried powder dried to 120° C.
Figure 4A:
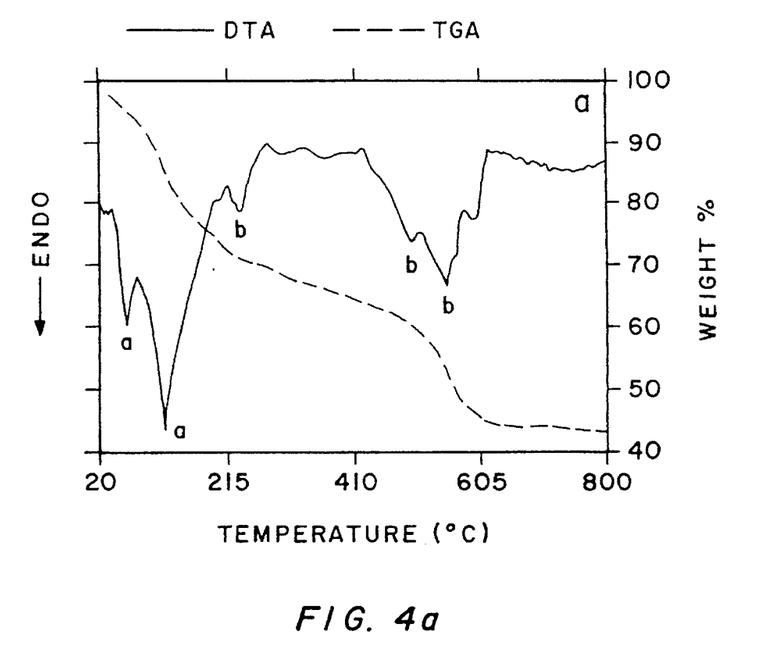
FIG. 4a is a DTA and TGA trace of a freeze-dried powder dried to room temperature, indicating the presence of a substantial amount of residual water.
Figure 4B:
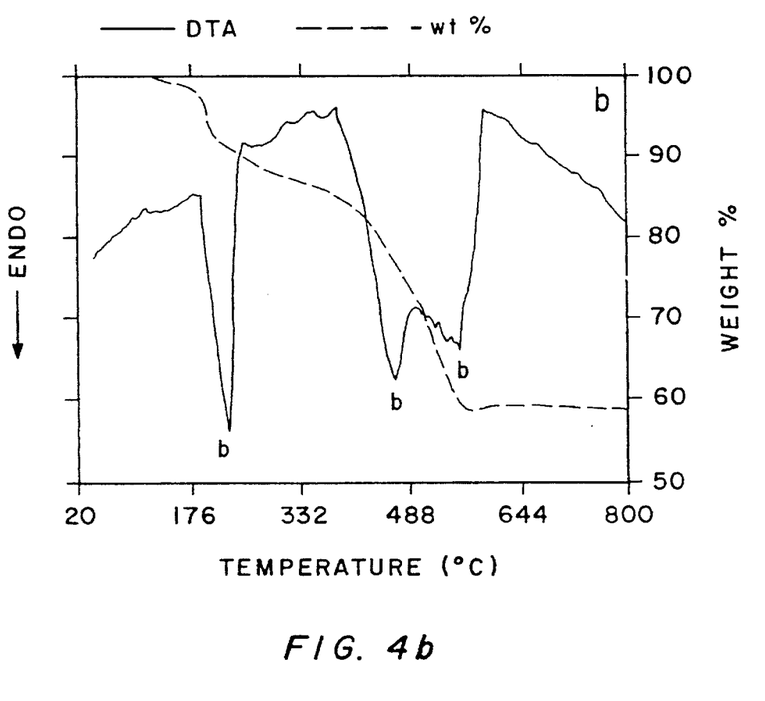
FIG. 4b is a DTA and TGA trace of the freeze dried powder dried to 120° C.

The freeze-drying process is very sensitive to the $NO_3^-$ concentration and the pH of the solutions. Any solutions used that had a pH outside of a narrow range (0.3–0.7) melted during the drying step. The splat-freezing process disclosed herein led to the formation of amorphous precursors. FIG. 2 shows an XRD plot of the powders dried at 120° C. The only peaks seen are for $Sr(NO_3)_3 \cdot xH_2O$, which could be due to the sample incorporating waters of crystallization when exposed to air. The particle morphology of the powder dried to room temperature is shown in FIG. 3. The individual particle size is seen to be of the order of 1 µm. DTA and TGA traces, shown in FIG. 4a, on the same powder, indicate the presence of a substantial amount of residual water, associated with the waters of hydration of the nitrate salts. The endotherms seen below 150° C. on the DTA trace correspond to the removal of waters of hydration and melting of the sample. Dehydration is accomplished by heating the sample at the rate of 5° C./hr under flowing argon. The DTA trace in FIG. 4b on the dehydrated powder indicates the absence of endotherms associated with melting and water removal. A TGA trace on the same powder indicates that the residual water content is small, of the order of 1.5 weight % of the sample. Further, both TGA and DTA traces indicate that denitration of the sample is complete by 600° C.

Figure 5:
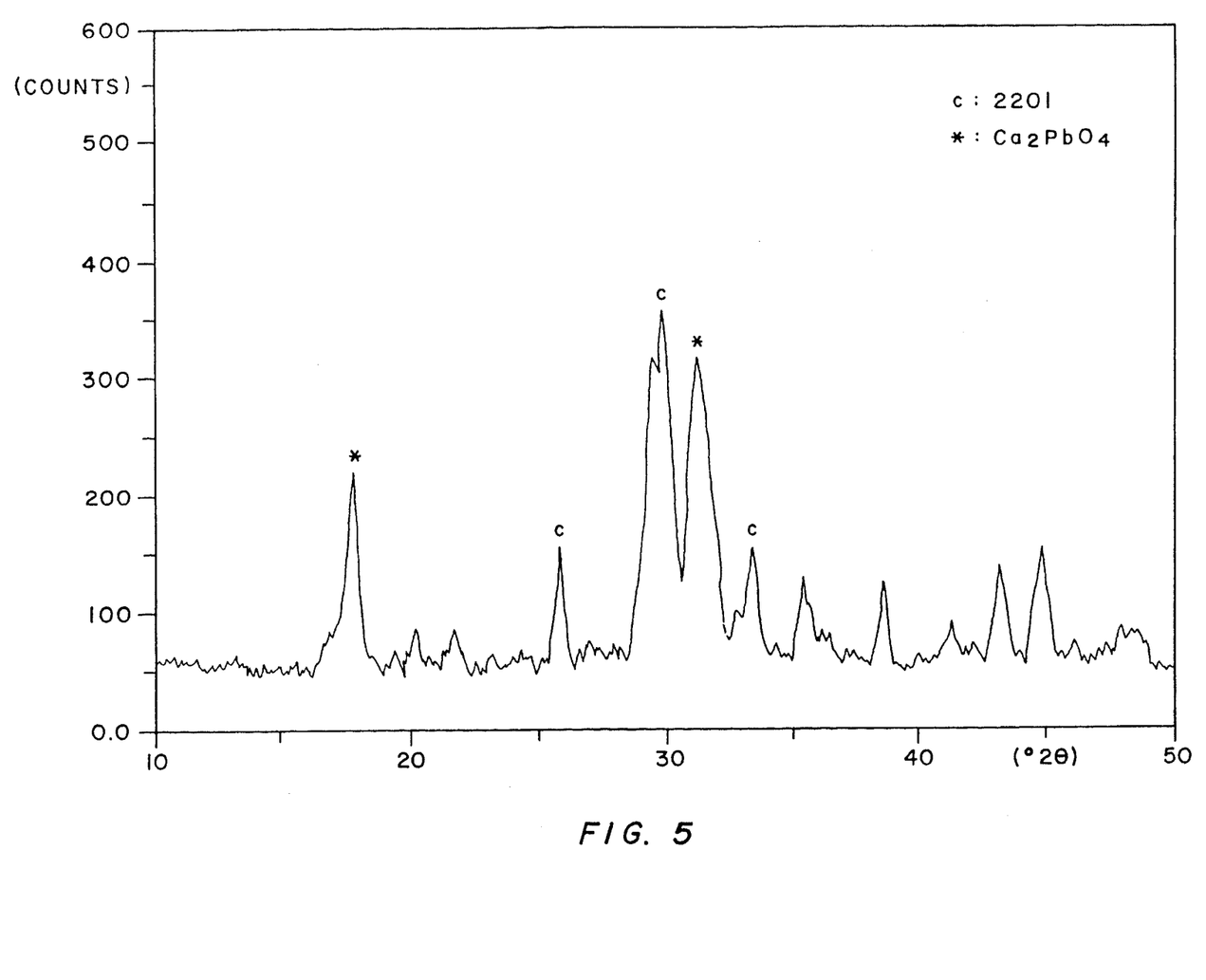
FIG. 5 is an XRD of the freeze-dried powder flash-calcined at 730° C. in 22% $O_2$.
Figure 6:
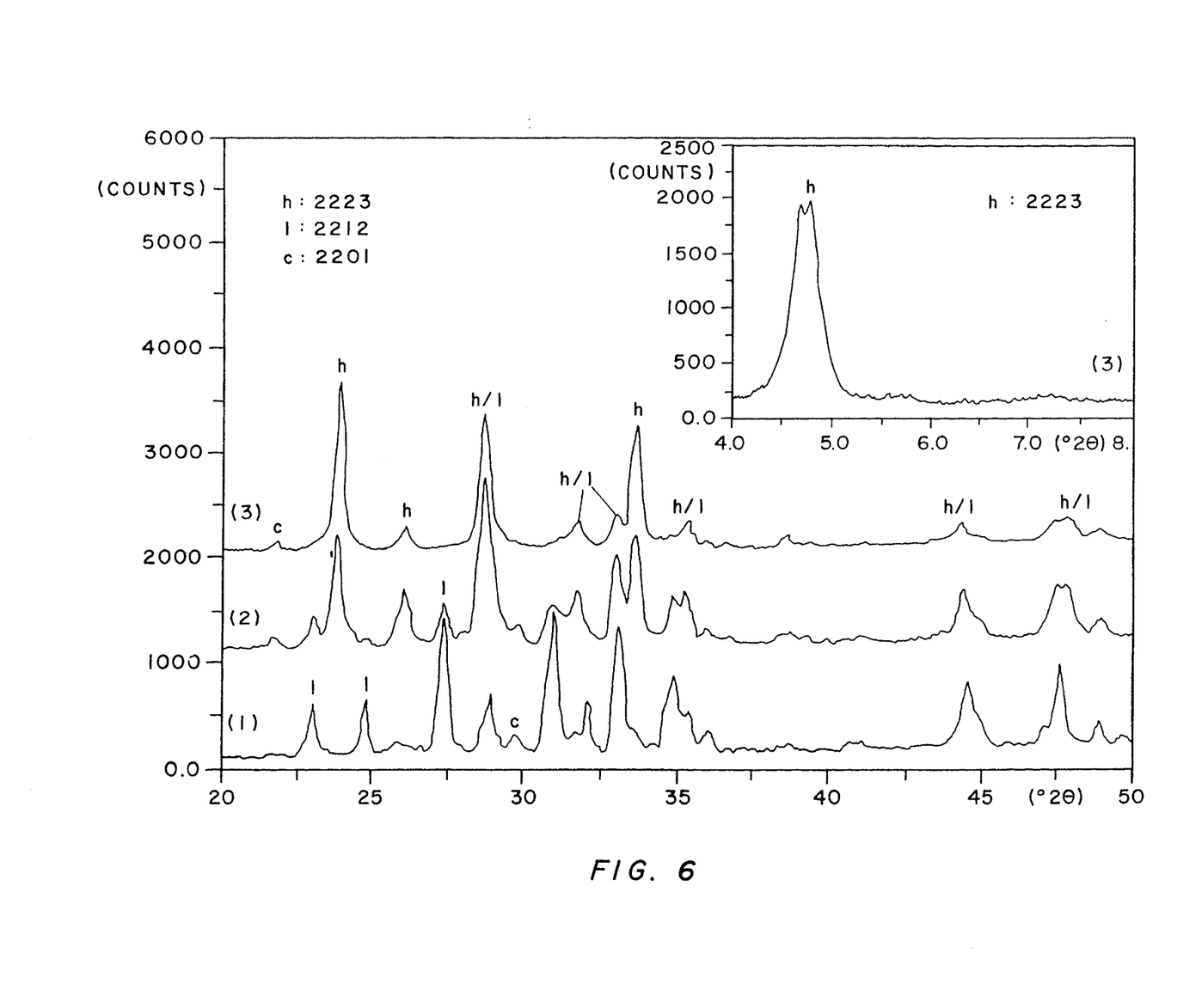
FIG. 6 shows XRD patterns of samples of freeze-dried powders after crushing and pelletizing at a pressure of 500 MPa and introduction in a furnace preheated to 845° C. in 7% $O_2$.

The dehydrated powders were denitrated by introducing them into a furnace preheated to temperatures ranging from 600° C. to 730° C. in an atmosphere of 22% $O_2$ and holding for 1 hr. The XRD pattern in FIG. 5 indicates the presence of $Bi_2Sr_2CuO_x$ (2201) and $Ca_2PbO_4$ as the major phases. TGA was used to determine the onset temperature of the melting reaction, involving $Ca_2PbO_4$, as a function of oxygen partial pressure. These data are summarized in Table 1. Denitration temperatures were chosen to be below the liquid-phase formation temperature. The denitrated powders were then crushed and pelletized at a pressure of 500 MPa and introduced into a furnace preheated to 845° C. and an atmosphere of 7% $O_2$. XRD patterns of samples held for varying times are shown in FIG. 6; each step is accompanied by regrinding and pelletizing. A sample held for 2 hrs shows the primary phase to be $Bi_2Sr_2CaCu_2O_x$ (2212). Sintering for an additional 5 hr indicates the major phase to be 2223; however the presence of 2212 is seen from the XRD data. A further sintering of 5 hr indicates the sample to be 2223 (Sample A). The low angle peaks for Sample A are shown as an insert in FIG. 6.

TABLE 1

| Effect of oxygen partial pressure on the temperature of liquid phase formation | |
|---|---|
| Temperature of liquid phase formation | Oxygen partial pressure (atms) |
| 836 | 1 |
| 820 | 0.4 |
| 808 | 0.2 |
| 791 | 0.07 |
| 772 | 0.02 |

Figure 7:
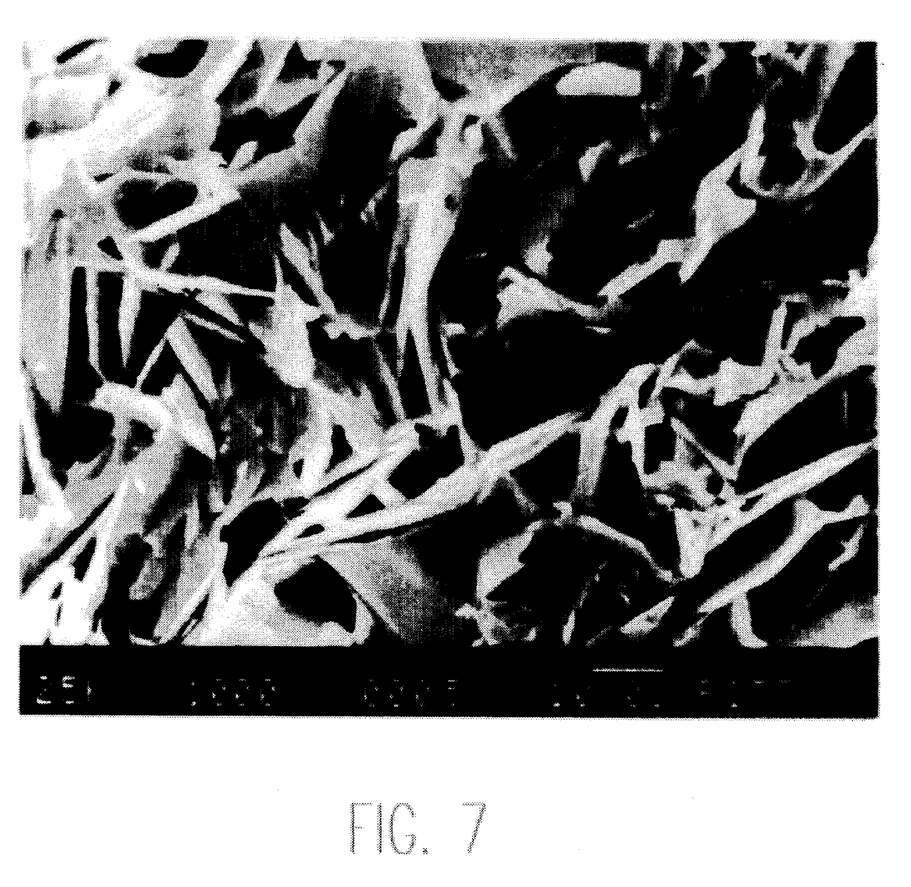
FIG. 7 is an SEM micrograph of the cross-section of a pellet sintered for 12 hours in 7% $O_2$ at 845° C., showing the micaceous morphology typical of the 2223 phase (referred to hereafter as "Sample A")
Figure 8A:
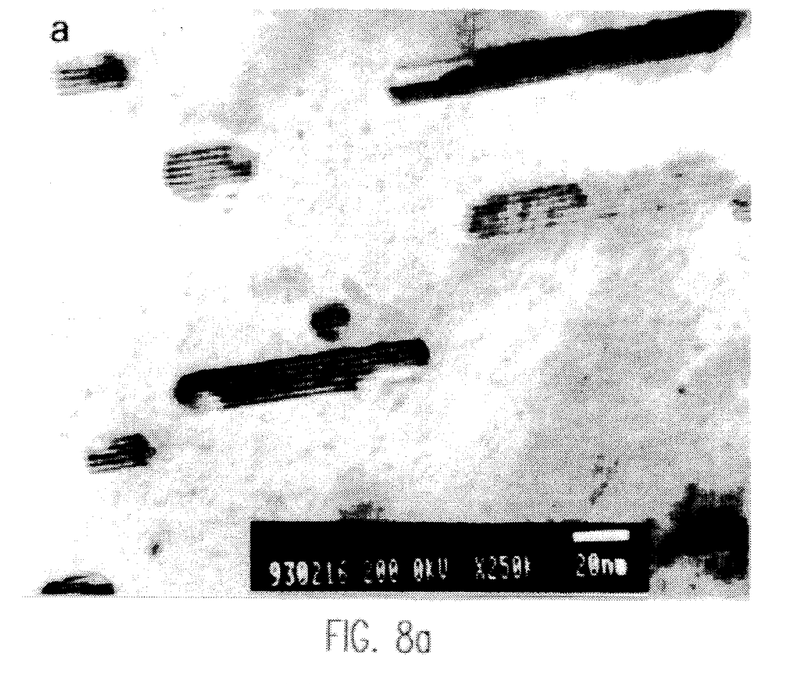
FIG. 8a is a TEM micrograph of Sample A.
Figure 8B:
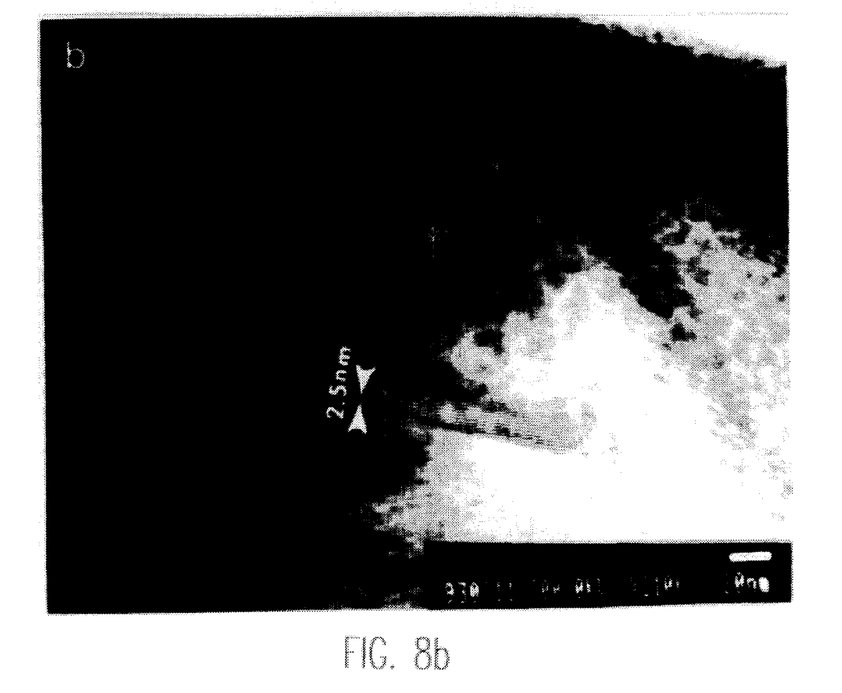
FIG. 8b is a high-resolution micrograph of Sample A.
Figure 9:
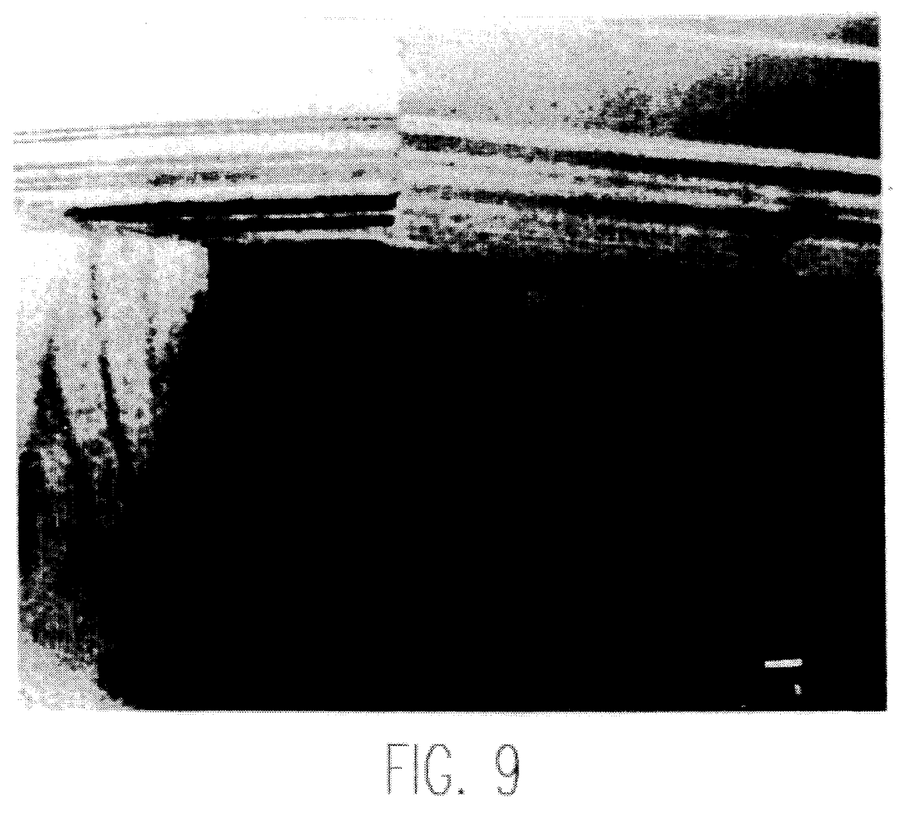
FIG. 9 shows a TEM micrograph of Sample A, with no observable grain boundary phase present.

SEM micrographs, in FIG. 7, of the cross section of a pellet sintered for 12 hrs in 7% $O_2$ at 845° C. shows the micaceous morphology typical of the phase. TEM micrographs of Sample A, in FIG. 8a, indicate fine particles within the grains of the 2223 phase. It should be noted that the micrograph shown is atypical in that it had an unusually large number of such particles within the 2223 grain. High-resolution microscopy establishes these to be the 2201 phase as seen from the lattice fringes, shown in FIG. 8b, which indicate a "c" axis of 25Å. EDS analysis shows these particles to be compositionally close to the 2201 phase. Lattice fringes from the matrix indicate a "c" axis of 37Å corresponding to the 2223 phase. The grain-to-grain contact between 2223 grains is seen to be good, with no observable grain-boundary phase present, as illustrated in FIG. 9.

Prior studies on the freeze-drying of superconductors have used atomization of solutions into liquid nitrogen as a means of achieving freezing. There are two disadvantages to this process. One is that the rates of freezing achieved by atomization into liquid nitrogen are modest. Lower freezing rates allow for the growth of ice crystals and a subsequent segregation of the solute. The second limitation, inherent in any atomization process, is the low output of the process in terms of product quantity. In the splat-freezing process disclosed herein, both of these limitations are overcome. The heat transfer rates obtained by splat-freezing the solutions against a metal surface cooled to liquid nitrogen temperature are sufficient to generate amorphous precursors. Such high cooling rates ensure that segregation of the solute in the freezing process is minimized and the atomic-scale mixing obtained in the liquid is preserved in the frozen material. The melting of these amorphous samples outside a narrow range of pH and $NO_3$ concentration is the result of a phase separation into solute-rich and solute-poor regions. Such phase separation results in loss of chemical homogeneity and a subsequent reduction in the reactivity of the powders leading to a much slower rate of 2223 formation. Thus, control of pH and $NO_3^-$ are critical in the freeze-drying process.

A further occurrence of melting is seen in the freeze-dried nitrate samples, which contain hydrated metal nitrates. This is due to the presence of $Ca(NO_3)_2 \cdot 4H_2O$ (m.p. 42° C.) and $Cu(NO_3)_2 \cdot 3H_2O$ (m.p. 112° C.). Flash-heating the hydrated sample to above the temperature of decomposition of the nitrates does not completely avoid melting. This is particularly true of a packed bed, such as a powder in a crucible. A dehydration step with low heating rates (5° C./hr) is required to remove the waters of crystallization from the sample without causing melting.

It has previously been suggested that the 2223 phase grows from a partially molten phase containing $Ca_2PbO_4$. Therefore, in the initial calcination step for the freeze-dried precursor the temperature was chosen to be below the temperature of liquid phase formation. The high reactivity of the 2223 powders is seen from formation of a significant fraction of 2223 after holding for 7 hr, and nearly phase-clean 2223 is seen after 12 hr. An additional point to note is the split peak for the 002 reflection of the 2223 phase for Sample A in the XRD data shown in FIG. 6. The nature of this structural modulation is currently being investigated. The displacement fringe contrast seen in FIG. 8a is due to the partially coherent 2201 particles in the 2223 matrix. Due to the similar values of the "a" axis of the 2223 and the 2201 phases (a=5.4Å), it is energetically favorable to establish coherency along the basal planes, implying that the caxes are parallel for both the matrix and the particles. The grain boundaries are clean, with good contact between adjacent 2223 grains. The absence of a grain-boundary phase in these materials is particularly encouraging from the standpoint of maximizing critical current density ($J_c$) values in these materials. The presence of small amounts of impurity phases need not lead to a decrease in the transport properties of the superconducting material. It is the presence of a continuous transport path for supercurrent through the material that is of importance.

The application of these precursors for wire fabrication through a powder-in-tube process offers significant potential. Sintering times with freeze-dried powders are one order of magnitude shorter than for powders obtained from conventional solid-state processing, which typically requires 200–300 hr of sintering to achieve near-single-phase 2223. Therefore long length conductor fabrication using powders derived by the freeze drying technique is commercially and economically viable. Further, the possibility of sufficiently small coherent particles of 2201 in the matrix may provide sites for flux pinning.

There has thus been shown a freeze-drying approach incorporating a splat-freezing process adopted for the synthesis of the 2223 phase from nitrate precursors. The freeze-dried nitrate precursor is seen to be highly reactive, leading to single-phase 2223 material after 12 hr of sintering. TEM coupled with EDS analysis indicates that the 2201 particles are present within the 2223 gains. The presence of these coherent particles in the matrix may provide sites for flux pinning. The gain boundaries of the 2223 gains are free from secondary phases, allowing for good contact between the 2223 gains.

The foregoing description of a preferred embodiment of the invention has been presented for purposes of illustration and description. It is not intended to be exhaustive or to limit the invention to the precise form disclosed, and obviously many modifications and variations are possible in light of the above teaching. The embodiment was chosen and described to best explain the principles of the invention and its practical application and thereby enable others skilled in the art to best utilize the invention in various embodiments and with various modifications as are suited to the particular use contemplated. It is intended that the scope of the invention be defined by the claims appended hereto.

The embodiments of the invention in which an exclusive property is claimed are defined as follows:

1. A process for the rapid formation of phase-clean 110K (Bi-2223) superconducting powders comprising:

a) splat freezing a nitrate solution of Bi, Pb, Sr, Ca, and Cu to form flakes of the solution without any phase separation, said nitrate solution having a pH in the range of 0.3 to 0.7;

b) grinding the frozen flakes to form a powder;

c) freeze-drying the frozen powder;

d) heating the dried powder to form a dry green precursor powders;

e) denitrating the green-powders;

f) heating the denitrated powders into pellets to form phase-clean 110K (Bi-2223) superconducting powders.

2. The process of claim 1 wherein the splat freezing step includes mixing the nitrate solution in the cation ratio of Bi/Pb/Sr/Ca/Cu=1.8:0.4:2:2:2.3, with the Pb added in the form of PbO.

3. The process of claim 2 wherein the splat-freezing step includes injecting the nitrated solution onto a liquid nitrogen cooled block such that the solution immediately freezes.

4. The process of claim 3 wherein the drying step includes transferring the powder to a freeze-dryer initially operating at a temperature of about −40° C. and gradually rising to a temperature of about 20° C., and then heating to a temperature of about 125° C. under an atmosphere of argon such that the powder is dehydrated so that melting of the powder is avoided during subsequent heating.

5. The process of claim 4 wherein the denitrating step includes flash-calcining the dehydrated powder at a temperature between 600° C. and 730° C. in a 22% $O_2$ gas flow.

6. The process of claim 5 wherein the denitrating step further includes grinding the denitrated powder, and then heating the powder to about 840° C. for less than 12 hours to form the phase-clean 110K (Bi-2223).

\* \* \* \* \*

UNITED STATES PATENT AND TRADEMARK OFFICE
CERTIFICATE OF CORRECTION

PATENT NO. : 5,523,285
DATED : June 4, 1996
INVENTOR(S) : Uthamalingam Balachandran, et. al.

It is certified that error appears in the above-identified patent and that said Letters Patent is hereby corrected as shown below:

On title page, the Inventor [75] should read:

--Inventors: Uthamalingam Balachandran,
    Hinsdale, Il.

Padmanabban Krishnaraj,
      Pittsburgh, Pa.

Nicholas G. Eror
      Pittsburgh, Pa.

Milan Lelovic
      Pittsburgh, Pa.--.

Signed and Sealed this

Third Day of December, 1996

*Attest:*

BRUCE LEHMAN

*Attesting Officer*      *Commissioner of Patents and Trademarks*